United States Patent
Yamada et al.

(10) Patent No.: US 10,212,805 B2
(45) Date of Patent: Feb. 19, 2019

(54) PRINTED CIRCUIT BOARD AND ELECTRIC DEVICE

(71) Applicant: FUJITSU LIMITED, Kawasaki-shi, Kanagawa (JP)

(72) Inventors: Tetsuro Yamada, Kawasaki (JP); Akiko Matsui, Meguro (JP); Mitsuhiko Sugane, Ichikawa (JP); Takahide Mukoyama, Kamakura (JP); Yoshiyuki Hiroshima, Nakano (JP); Kohei Choraku, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/807,648

(22) Filed: Nov. 9, 2017

(65) Prior Publication Data
US 2018/0184514 A1   Jun. 28, 2018

(30) Foreign Application Priority Data
Dec. 27, 2016   (JP) ................. 2016-252927

(51) Int. Cl.
*H05K 1/11*   (2006.01)
*H05K 1/02*   (2006.01)
(Continued)

(52) U.S. Cl.
CPC ..... *H05K 1/0213* (2013.01); *H01L 23/49816* (2013.01); *H01L 24/16* (2013.01); *H05K 1/0265* (2013.01); *H05K 1/115* (2013.01); *H05K 1/116* (2013.01); *H05K 1/181* (2013.01); *H01L 2224/16235* (2013.01); *H01L 2924/15311* (2013.01); *H05K 1/113* (2013.01); *H05K 2201/0979* (2013.01); *H05K 2201/09463* (2013.01); *H05K 2201/09609* (2013.01); *H05K 2201/10378* (2013.01); *H05K 2201/10734* (2013.01)

(58) Field of Classification Search
CPC ... H05K 1/02; H05K 1/11; H05K 7/08; H01L 23/58
USPC ............ 361/767, 306.3, 309, 760, 780, 788; 257/296, 774; 174/260, 262, 266
See application file for complete search history.

(56) References Cited

U.S. PATENT DOCUMENTS

| | | | | |
|---|---|---|---|---|
| 6,370,013 B1 * | 4/2002 | Iino | ...................... | H01G 4/2325 257/E23.062 |
| 6,388,208 B1 * | 5/2002 | Kiani | ................... | H05K 1/0222 174/260 |

(Continued)

FOREIGN PATENT DOCUMENTS

| | | |
|---|---|---|
| JP | 3-36791 | 2/1991 |
| JP | 2005-12088 | 1/2005 |

(Continued)

*Primary Examiner* — Xiaoliang Chen
(74) *Attorney, Agent, or Firm* — Fujitsu Patent Center

(57) ABSTRACT

A printed circuit board includes a power feeding layer to which a power supply voltage is applied, a plurality of power feeding terminals that is disposed in an area, in which an electronic component is mounted, and supplies current based on the power supply voltage to the electronic component, and a plurality of vias that electrically interconnects the plurality of power feeding terminals and the power feeding layer, and is formed such that a via coupled to a power feeding terminal disposed closer to an end of the area has a smaller via-diameter.

9 Claims, 13 Drawing Sheets

(51) Int. Cl.
*H05K 1/18* (2006.01)
*H01L 23/498* (2006.01)
*H01L 23/00* (2006.01)

(56) References Cited

U.S. PATENT DOCUMENTS

| | | | |
|---|---|---|---|
| 7,336,502 B1* | 2/2008 | Goergen | H05K 1/0251 |
| | | | 361/780 |
| 2006/0050491 A1* | 3/2006 | Hayashi | H05K 1/0231 |
| | | | 361/760 |
| 2008/0087460 A1* | 4/2008 | Fung | H05K 1/0251 |
| | | | 174/262 |
| 2011/0220979 A1* | 9/2011 | Kawashima | H01L 23/50 |
| | | | 257/296 |
| 2011/0226516 A1 | 9/2011 | Takeda | |
| 2013/0170155 A1 | 7/2013 | Kashiwakura | |
| 2015/0106042 A1* | 4/2015 | Fujimori | G06F 17/5036 |
| | | | 702/58 |

FOREIGN PATENT DOCUMENTS

| | | |
|---|---|---|
| JP | 2008-210944 | 9/2008 |
| JP | 2011-198827 | 10/2011 |
| WO | 2012/039269 | 3/2012 |

* cited by examiner

FIG. 6

|  | CURRENT PATH P1 | CURRENT PATH P2 | CURRENT PATH P3 | CURRENT PATH P4 |
|---|---|---|---|---|
| VIA-DIAMETER r [mm] | 0.30 | 0.25 | 0.25 | 0.15 |
| PLATING THICKNESS pt [$\mu$m] | 20 | 20 | 20 | 20 |
| OPENING-FILLING RESIN MATERIAL | NON-CONDUCTIVE | NON-CONDUCTIVE | NON-CONDUCTIVE | NON-CONDUCTIVE |
| VIA-RESISTANCE RV [m$\Omega$] | 0.23 | 0.34 | 0.75 | 1.32 |
| PATH-RESISTANCE RL [m$\Omega$] | 1.13 | 1.01 | 0.51 | 0.00 |
| RESISTANCE RA [m$\Omega$] (CURRENT RATIO) | 1.36 (0.97) | 1.35 (0.98) | 1.26 (1.05) | 1.32 (1.00) |

FIG. 7

|  | CURRENT PATH P1 | CURRENT PATH P2 | CURRENT PATH P3 | CURRENT PATH P4 |
|---|---|---|---|---|
| VIA-DIAMETER r [mm] | 0.25 | 0.25 | 0.25 | 0.25 |
| PLATING THICKNESS pt [$\mu$m] | 20 | 20 | 20 | 20 |
| OPENING-FILLING RESIN MATERIAL | NON-CONDUCTIVE | NON-CONDUCTIVE | NON-CONDUCTIVE | NON-CONDUCTIVE |
| VIA-RESISTANCE RV [m$\Omega$] | 0.29 | 0.29 | 0.29 | 0.29 |
| PATH-RESISTANCE RL [m$\Omega$] | 0.52 | 0.34 | 0.17 | 0.00 |
| RESISTANCE RA [m$\Omega$] (CURRENT RATIO) | 0.81 (0.35) | 0.63 (0.46) | 0.46 (0.63) | 0.29 (1.00) |

FIG. 10

|  | CURRENT PATH P1 | CURRENT PATH P2 | CURRENT PATH P3 | CURRENT PATH P4 |
|---|---|---|---|---|
| VIA-DIAMETER r [mm] | 0.30 | 0.25 | 0.25 | 0.25 |
| PLATING THICKNESS pt [$\mu$m] | 20 | 20 | 20 | 20 |
| OPENING-FILLING RESIN MATERIAL | CONDUCTIVE | CONDUCTIVE | CONDUCTIVE | NON-CONDUCTIVE |
| VIA-RESISTANCE RV [m$\Omega$] | 0.21 | 0.30 | 0.53 | 0.75 |
| PATH-RESISTANCE RL [m$\Omega$] | 0.52 | 0.34 | 0.17 | 0.00 |
| RESISTANCE RA [m$\Omega$] (CURRENT RATIO) | 0.73 (1.03) | 0.64 (1.17) | 0.70 (1.07) | 0.75 (1.00) | ature and advantages of the invention will be # PRINTED CIRCUIT BOARD AND ELECTRIC DEVICE

CROSS-REFERENCE TO RELATED APPLICATION

This application is based upon and claims the benefit of priority of the prior Japanese Patent Application No. 2016-252927, filed on Dec. 27, 2016, the entire contents of which are incorporated herein by reference.

FIELD

The embodiments discussed herein are related to a printed circuit board and an electronic device.

BACKGROUND

A printed circuit board, which is mounted in various electronic devices, includes a signal wiring layer on which a signal wiring is formed, a power feeding layer on which a power supply wiring is formed, and a via, which electrically interconnects a terminal (a power feeding terminal or a signal terminal) formed on the surface of the printed circuit board and the signal wiring layer or the power feeding layer.

On the printed circuit board, an electronic component such as, for example, a package (hereinafter, abbreviated as a PKG in some cases) including, for example, a large scale integrated (LSI) circuit may be mounted. A power supply voltage for the electronic component is applied to the power supply wiring (power feeding layer) of the printed circuit board. In addition, power supply current is supplied to the electronic components via the power supply wiring, the via, and the power feeding terminal of the printed circuit board. In order to secure a power feeding amount, a plurality of power feeding terminals may be provided on the electronic component, and a plurality of vias and a plurality of power feeding terminals may be formed on the printed circuit board. In recent years, as the current supplied per one element has become larger, the number of pins of a power feeding terminal in the element is being increased. Accordingly, many power feeding terminals may also be disposed on the printed circuit board.

In addition, as a technology of controlling the distribution of current on the printed circuit board, a technology of limiting the direction in which current flows by forming a slit in a planar power supply wiring for supplying power from a power supply to an LSI circuit has been proposed. In addition, there has been proposed a technology of branching, on a board, a power supply wiring in isometric manner in the form of a tournament by taking any one point on the upstream side of a current path as a branch point, and connecting an electronic component to each of plural ends of the power supply wiring obtained by branching.

In the conventional printed circuit board having plural power feeding terminals, resistance components of current paths, which lead to the respective power feeding terminals, become uneven due to the difference in the positions at which the respective power feeding terminals are disposed, which causes the power feeding amounts from the respective power feeding terminals to become uneven. Thus, there is a possibility that excessive current may flow in a portion.

The followings are reference documents.
[Document 1] Japanese Laid-Open Patent Publication No. 2011-198827,
[Document 2] Japanese Laid-Open Patent Publication No. 03-036791,
[Document 3] Japanese Laid-Open Patent Publication No. 2005-012088,
[Document 4] International Publication Pamphlet No. WO 2012-039269, and
[Document 5] Japanese Laid-Open Patent Publication No. 2008-210944.

SUMMARY

According to an aspect of the invention, a printed circuit board includes a power feeding layer to which a power supply voltage is applied, a plurality of power feeding terminals that is disposed in an area, in which an electronic component is mounted, and supplies current based on the power supply voltage to the electronic component, and a plurality of vias that electrically interconnects the plurality of power feeding terminals and the power feeding layer, and is formed such that a via coupled to a power feeding terminal disposed closer to an end of the area has a smaller via-diameter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a view illustrating a calculation example of the resistance of a current path;

FIG. 7 is a view illustrating a calculation example of the resistances of current paths in a printed circuit board of a comparative example;

FIG. 10 is a view illustrating a calculation example of the resistances of current paths;

DESCRIPTION OF EMBODIMENTS

Hereinafter, modes for carrying out the present disclosure will be described with reference to the accompanying drawings.

First Embodiment

Figure 1:
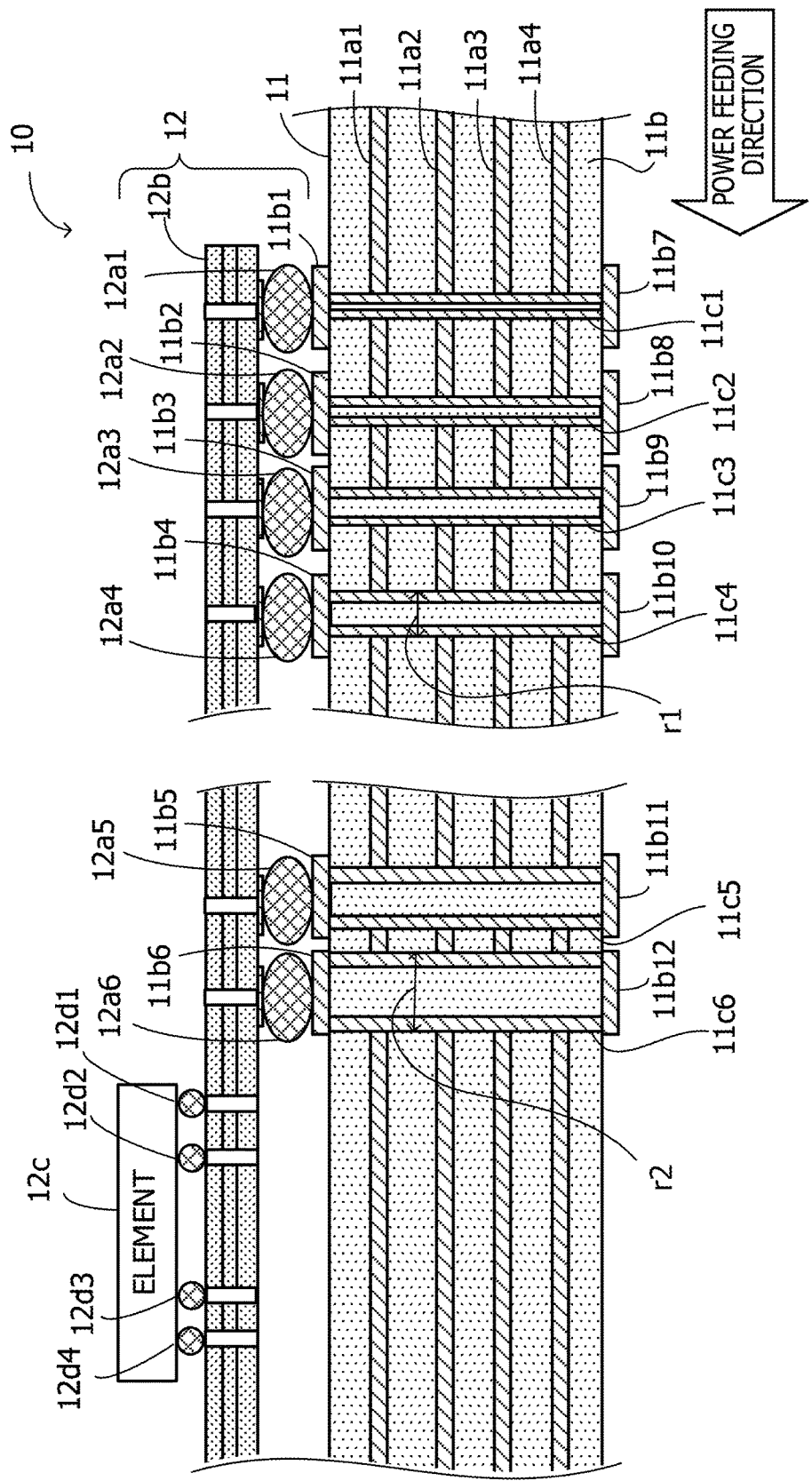
FIG. 1 is a cross-sectional view illustrating an example of a printed circuit board and an electronic device according to a first embodiment.

FIG. 1 is a cross-sectional view illustrating an example of a printed circuit board and an electronic device according to a first embodiment.

Figure 2:
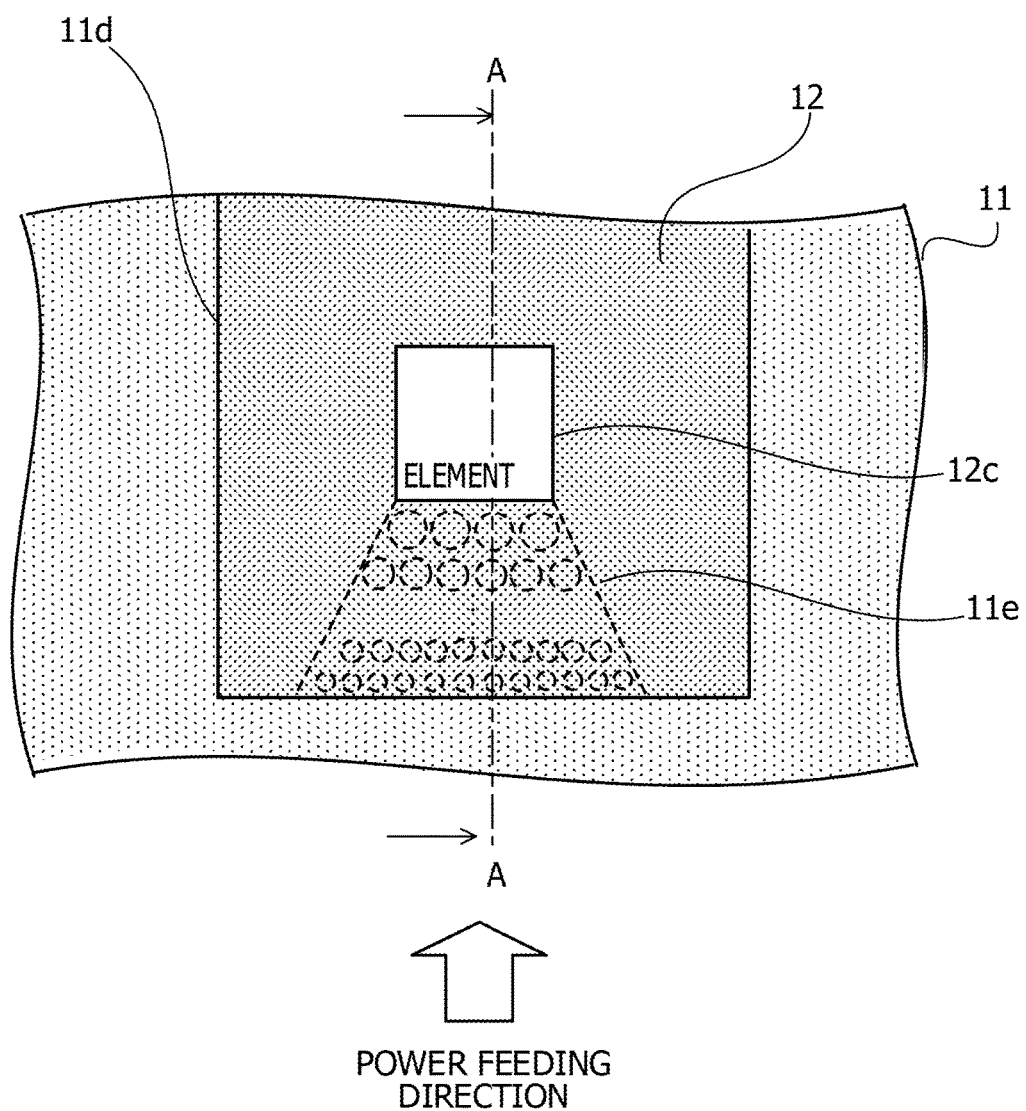
FIG. 2 is a plan view illustrating an example of the printed circuit board and the electronic device according to the first embodiment.

In addition, FIG. 2 is a plan view illustrating an example of the printed circuit board and the electronic device according to the first embodiment. FIG. 1 is a cross-sectional view taken along line A-A of FIG. 2. The electronic device 10 of the first embodiment includes a printed circuit board 11 and an electronic component 12 (hereinafter, referred to as a PKG).

The printed circuit board 11 includes power feeding layers 11a1, 11a2, 11a3 and 11a4 to which a power supply voltage is applied. The power feeding layers 11a1 to 11a4 are stacked one on another with an insulating material 11b interposed therebetween. As for the power feeding layers 11a1 to 11a4, for example, a conductive material such as, for example, copper is used. In addition, the insulating material 11b is, for example, a plurality of sheets obtained by impregnating paper or glass cloth with an insulating resin. In addition, the number of power feeding layers is not limited to four, and may be one, or five or more.

In addition, the printed circuit board 11 includes a plurality of power feeding terminals (e.g., power feeding terminals 11b1, 11b2, 11b3, 11b4, 11b5 and 11b6), which is disposed in an area 11d in which the PKG 12 is mounted (see, for example, FIG. 2) and supplies current based on the power supply voltage to the PKG 12. In the example of FIG. 2, the plurality of power feeding terminals is not uniformly provided on the area 11d, but are concentrated on a certain area (power feeding area 11e). In addition, in the example of FIG. 1, on the printed circuit board 11, a plurality of power feeding terminals (e.g., power feeding terminals 11b7, 11b8, 11b9, 11b10, 11b11 and 11b12) is formed on a surface opposite to the surface on which the PKG 12 is mounted. As for the plurality of power feeding terminals, for example, a conductive material such as, for example, copper is used.

In addition, the printed circuit board 11 includes a plurality of vias (e.g., vias 11c1, 11c2, 11c3, 11c4, 11c5 and 11c6), which electrically interconnect the plurality of power feeding terminals and the power feeding layers. Each via has a plating (e.g., copper plating) formed on the inner wall of an opening thereof and a nonconductive resin material injected into the opening. In addition, in the example of FIG. 1, each of the vias 11c1 to 11c6 is connected to the power feeding layers 11a1 to 11a4, but is not limited to this example. By changing the number of power feeding layers to be connected, the resistance values of current paths, which lead to the power feeding terminals, may be adjusted (an example of which will be described later).

In the printed circuit board 11 of the first embodiment, a via, which is connected to the power feeding terminal disposed closer to the end of the area 11d in which the PKG 12 is mounted, has a smaller via-diameter. In the case of a power feeding direction illustrated in FIGS. 1 and 2, a via, which is connected to the power feeding terminal disposed at a position to which a distance from the end of the area 11d is shorter, is located on the upstream side of the current path in which the current based on the power supply voltage flows. For example, in the case of the power feeding direction illustrated in FIGS. 1 and 2, the via 11c4 is located on the upstream side of the current path than the via 11c6. Therefore, the via-diameter r1 of the via 11c4 is less than the via-diameter r2 of the via 11c6.

The PKG 12 is, for example, a PKG using a ball grid array (BGA). The PKG 12 includes a PKG substrate 12b, which is electrically connected to the plurality of power feeding terminals of the printed circuit board 11 through solder bumps (e.g., solder bumps 12a1, 12a2, 12a3, 12a4, 12a5, and 12a6). The PKG substrate 12b is also formed with wirings or vias through which the current supplied from the printed circuit board 11 flows. On the PKG substrate 12b, an element 12c such as, for example, an LSI circuit is disposed. The element 12c receives the current supplied from the PKG substrate 12b through a plurality of solder bumps (e.g., solder bumps 12d1, 12d2, 12d3 and 12d4).

In addition, in FIG. 1, in the printed circuit board 11 or the PKG board 12b, for example, a ground power supply layer that is at a ground potential, a signal wiring layer through which signals are propagated, and vias connected thereto are not illustrated. For example, the vias connected to the signal wiring layer are provided to be located outside the power feeding area 11e illustrated in FIG. 2. This is equally applicable to each embodiment to be described later.

The printed circuit board 11 according to the first embodiment as described above has the following effects.

When the respective vias have the same via-diameter, the path-resistance is reduced because a current path including the via connected to the power feeding terminal disposed close to the end of the area 11d is shorter than a current path including a via disposed close to the center of the area 11d. Therefore, there is a possibility that excessive current will flow due to uneven resistance components.

Figure 3:
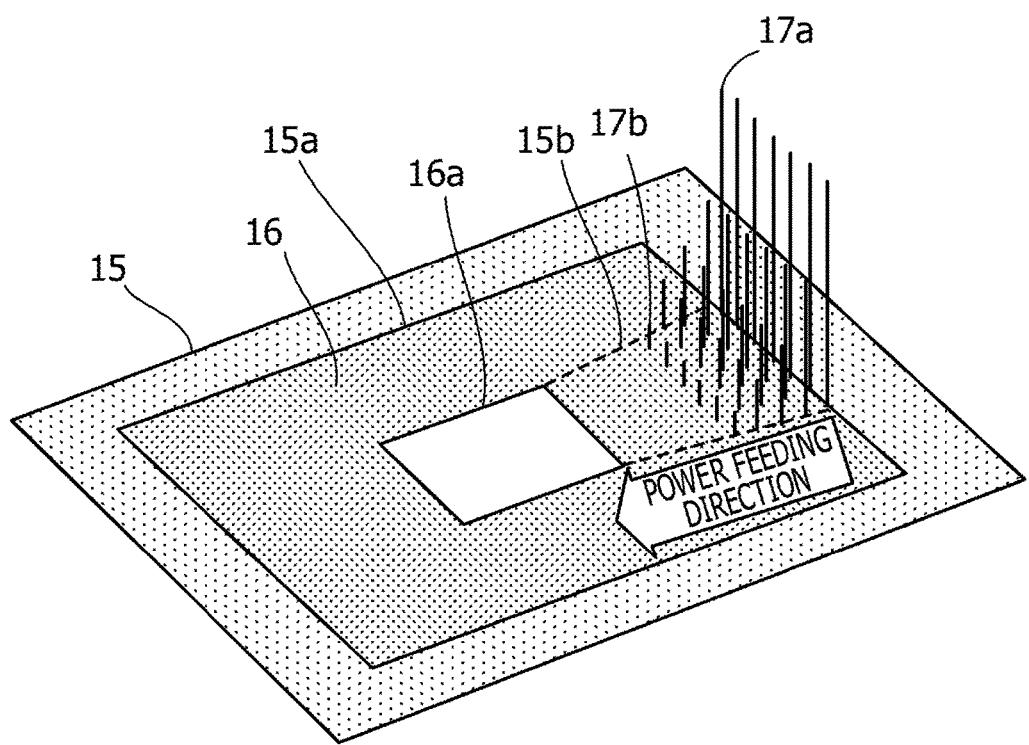
FIG. 3 is a view illustrating an example of via-current distribution.

FIG. 3 is a view illustrating an example of distribution of via-current.

FIG. 3 illustrates an example of distribution of via-current when, on a printed circuit board 15, a plurality of power feeding terminals is provided in a power feeding area 15b of an area 15a in which a PKG 16 is mounted, and the respective power feeding terminals are connected to power feeding layer through a plurality of vias having the same via-diameter. In addition, FIG. 3 illustrates an element 16a disposed in the PKG 16. The plurality of power feeding terminals, the power feeding layer, the plurality of vias, and the like are not illustrated.

As illustrated in FIG. 3, the via-current (e.g., indicated by a straight line 17a) of a via, which is connected to a power feeding terminal located close to the end of the area 15a, is larger than the via-current (e.g., indicated by a straight line 17b) of a via, which is connected to a power feeding terminal located close to the center of the area 15a. Thus, there is a possibility that excessive current will flow in the via, which is connected to the power feeding terminal located close to the end of the area 15a.

On the contrary, in the printed circuit board 11 of the first embodiment as illustrated in FIGS. 1 and 2, the via-diameters of the plurality of vias are smaller in the via connected to the power feeding terminal closer to the end of the area 11d in which the PKG 12 is mounted. Therefore, the resistance of a via itself (via-resistance) is larger in a via connected to a power feeding terminal closer to the end of the area 11d. Meanwhile, the path-resistance by the power feeding layers 11a1 to 11a4 is smaller in the current path, which leads to the power feeding terminal closer to the end of the area 11d. Because the resistance of the current path, which leads to each power feeding terminal, is obtained from the sum of the via-resistance and the path-resistance having the above characteristics, the resistance values of the respective current paths in the printed circuit board 11 of the first embodiment are equalized.

Therefore, it is possible to suppress excessive current from flowing due to uneven resistance components. Thus, the occurrence of, for example, failures or heat generation due to excessive current is suppressed, and the reliability or safety of the electronic device 10 is increased.

In addition, in order to equalize the resistance components of a plurality of current paths, it is conceivable to apply a technology of controlling the distribution of current on the printed circuit board described above. However, it is difficult, in terms of layout, to apply this technology to a printed circuit board on which, for example, a PKG substrate is mounted using a BGA having a large number of pins at a narrow pitch in such a manner that a plurality of power feeding terminals is concentrated on one area as illustrated in FIG. 2. For this reason, in the printed circuit board 11 of the first embodiment, the difference in the resistance values of the respective current paths is suppressed by merely changing the via-diameters of the vias.

In addition, in the above description, the plurality of power feeding terminals is not uniformly provided in the area 11$d$, but is concentrated on a certain area (power feeding area 11$e$), but is not limited thereto, and for example, may be uniformly provided in the area 11$d$.

In addition, in FIG. 1, the element 12$c$ may be referred to as an electronic component, and the PKG substrate 12$b$ may be referred to as a printed circuit board. In that case, in the PKG substrate 12$b$, the via, which is connected to the power feeding terminal located closer to the end of the area of the PKG substrate 12$b$ in which the element 12$c$ is mounted, may have a smaller via-diameter.

Second Embodiment

Figure 4:
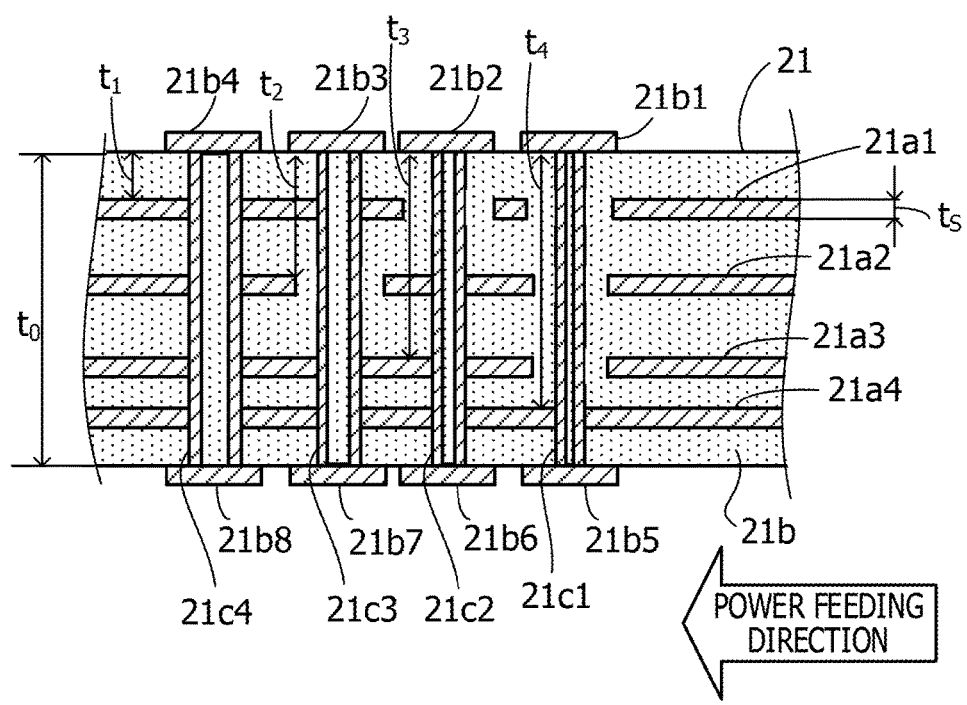
FIG. 4 is a cross-sectional view illustrating an example of a printed circuit board according to a second embodiment.

FIG. 4 is a cross-sectional view illustrating an example of a printed circuit board according to a second embodiment.

On the printed circuit board 21 of the second embodiment, for example, the PKG 12 illustrated in FIG. 1 is mounted, but is not illustrated in FIG. 4.

The printed circuit board 21 includes power feeding layers 21$a$1, 21$a$2, 21$a$3 and 21$a$4 to which a power supply voltage is applied. The power feeding layers 21$a$1 to 21$a$4 are stacked one on another via an insulating material 21$b$ interposed therebetween. As the power feeding layers 21$a$1 to 21$a$4, for example, a conductive material such as, for example, copper is used. In addition, the insulating material 21$b$ is, for example, a plurality of sheets in which paper or glass cloth is impregnated with an insulating resin. In addition, the number of power feeding layers is not limited to four, and may be one, or maybe five or more.

In addition, the printed circuit board 21 includes a plurality of power feeding terminals (e.g., power feeding terminals 21$b$1, 21$b$2, 21$b$3 and 21$b$4) disposed in the area in which the PKG is mounted. In addition, in the example of FIG. 4, on the printed circuit board 21, a plurality of power feeding terminals (e.g., power feeding terminals 21$b$5, 21$b$6, 21$b$7 and 21$b$8) is also formed on a surface opposite to the surface on which the PKG is mounted. As the plurality of power feeding terminals, for example, a conductive material such as, for example, copper is used.

In addition, the printed circuit board 21 includes a plurality of vias (e.g., vias 21$c$1, 21$c$2, 21$c$3 and 21$c$4), which electrically interconnects the plurality of power feeding terminals and a power feeding layer. Each via has a plating (e.g., copper plating) formed on the inner wall of an opening thereof and a nonconductive resin material injected into the opening.

In the printed circuit board 21 of the second embodiment, in the same manner as the printed circuit board 11 of the first embodiment, a via, which is connected to a power feeding terminal disposed closer to the end of the area in which the PKG is mounted, has a smaller via-diameter. For example, the power feeding terminal 21$b$1 connected to the via 21$c$1 is disposed closer to the end of the area in which the PKG is mounted than the power feeding terminal 21$b$4 connected to the via 21$c$4. Therefore, the via-diameter of the via 21$c$1 is smaller than the via-diameter of the via 21$c$4.

However, all of the via-diameters of the vias connected to the power feeding terminals having different distances from the end of the area in which the PKG is mounted may not necessarily differ from each other. The vias may be formed such that the via-diameters thereof vary stepwise. For example, among the vias 21$c$1 to 21$c$4 illustrated in FIG. 4, the via 21$c$1 may have the smallest via-diameter, the vias 21$c$2 and 21$c$3 may have the same via-diameter, and the via 21$c$4 may have the largest via-diameter.

In addition, depending on the number or positions of power feeding layers connected to the vias, the resistances of the current paths, which lead to the respective power feeding terminals, may be more equalized when the via-diameters of some via groups do not satisfy the above relationship. In that case, via-diameters for the some via groups may be set to be greater than those of other via groups even if the some via groups are connected to a power feeding terminal group to which a distance from the end of the area in which the PKG is mounted is shorter than a distance to another power feeding terminal group connected to the other via groups.

In addition, in the printed circuit board 21 according to the second embodiment, a via, which is connected to the power feeding terminal disposed closer to the end of the area in which the PKG is mounted, is connected to a smaller number of power feeding layers. In other words, a via, which is connected to a power feeding terminal disposed at a position to which the distance from the center of the area in which the PKG is mounted is shorter, is connected to a larger number of power feeding layers.

In the power feeding direction illustrated in FIG. 4, a via, which is connected to a power feeding terminal disposed closer to the end of the area in which the PKG is mounted, is located at the upstream side in the current path through which the current based on the power supply voltage flows. For example, in the case of the power feeding direction illustrated in FIG. 4, the via 21$c$1 is located in the current path upstream of the via 21$c$4. The via 21$c$4 is connected to four power feeding layers 21$a$1 to 21$a$4, whereas the via 21$c$1 is connected one power feeding layer 21$a$4, the number of which is smaller than the number of power feeding layers to which the via 21$c$4 is connected.

Figure 5:
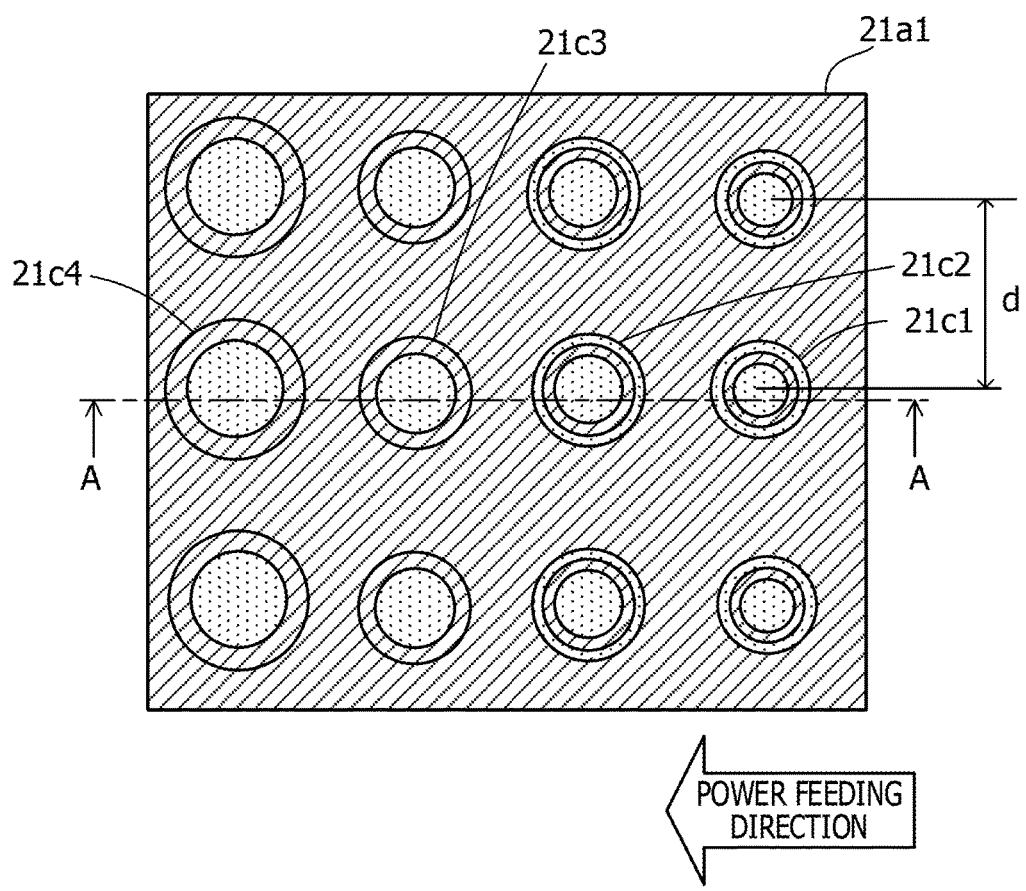
FIG. 5 is a plan view illustrating an example of a power feeding layer and vias.

FIG. 5 is a plan view illustrating an example of a power feeding layer and vias. FIG. 5 illustrates a plan view of the power feeding layer 21$a$1. For example, the cross section taken along line A-A of FIG. 5 is illustrated in the cross-sectional view of FIG. 4.

As illustrated in FIG. 5, the power feeding layer 21$a$1 is connected to the vias 21$c$3 and 21$c$4, but is not connected to the vias 21$c$1 and 21$c$2. In order to prevent the power feeding layer 21$a$1 from being connected to the vias 21$c$1 and 21$c$2, an opening (also referred to as a "clearance") having a diameter larger than the via-diameters of the vias 21$c$1 and 21$c$2 is formed by, for example, etching when manufacturing the power feeding layer 21$a$1.

In addition, in the printed circuit board 21 of the second embodiment, a via, which is connected to a power feeding terminal disposed at a position to which the distance from the center of the area in which the PKG is mounted is shorter, is connected to a power feeding layer, which is located at a position closer to the surface on which the PKG is mounted. In the example of FIG. 4, the via 21c4 is connected to the power feeding layer 21a1, which is located at the closest position to the surface on which the PKG is mounted (the upper surface of the printed circuit board 21 in FIG. 4). The via-resistance of a via, which is connected to a power feeding layer close to the surface on which the PKG is mounted, is less than the via-resistance of a via, which is connected to a power feeding layer located far from the surface on which the PKG is mounted.

With the above configuration, the via-resistance of a via, which is connected to a power feeding terminal close to the end of the area in which the PKG is mounted, may be increased, and the via-resistance of a via, which is connected to a power feeding terminal located close to the center of the area, may be reduced.

In addition, as the number of power feeding layers connected to a via is increased, the value of the path-resistance caused by the power feeding layers of the current path including the via is reduced. This is because the path-resistance is the resistance parallel to the path-resistance caused by each of the plurality of power feeding layers connected to the via.

Meanwhile, the path-resistance of each of the power feeding layers 21a1 to 21a4 is smaller in a current path, which leads to a power feeding terminal located closer to the end of the area in which the PKG is mounted. This is because a current path, which leads to the power feeding terminal located closer to the end of the area in which the PKG is mounted, has a shorter length.

The resistance of a current path, which leads to each power feeding terminal, is obtained from the sum of the via-resistance and the path-resistance having the above characteristics. Thus, in the printed circuit board 21 of the second embodiment, the resistance values of the respective current paths are equalized.

For example, when the via-diameter may not be changed to such an extent that the unevenness of resistance components may be sufficiently suppressed, due to, for example, layout or process restrictions, the resistance values of the respective current paths may be more equalized by combining the above-described configurations. Therefore, excessive current may be suppressed from flowing due to uneven resistance components.

Hereinafter, a calculation example of the resistance of each current path is illustrated.

In addition, hereinafter, it is assumed that the path-resistance by the power feeding layers 21a1 to 21a4 is not considered for a portion located at the right side of the via 21c1 on the drawing sheet of FIG. 4. In other words, the path-resistance outside the area in which the PKG is mounted is not considered.

The resistance RA of a current path, which leads to a certain power feeding terminal of the printed circuit board 21, is the sum of the via-resistance RV of the via connected to the power feeding terminal and the path-resistance RL by the power feeding layers 21a1 to 21a4 connected to the via.

The via-resistance RV is calculated based on the via-diameter r, the plating thickness pt of the via, the number of power feeding layers connected to the via, and the distance (via-length) $t_m$ of each power feeding layer from the surface on which the PKG is mounted. The cross-sectional area Sp of a conductor portion of the via is represented by Sp={$r^2$−$(r−pt)^2$}. Assuming that the conductor portion is formed of copper having electrical resistivity ρ, the resistance (via-resistance) $R_m$ of a single via is represented by $R_m$=ρ×$t_m$/Sp.

In addition, assuming that the number of power feeding layers connected to the via is n, 1/RV may be represented by the following Equation (1).

$$\frac{1}{RV} = \sum_{m=1}^{n}\left(\frac{1}{R_m}\right) \qquad (1)$$

The path-resistance RL of a certain power feeding layer is calculated based on the conductor thickness (the thickness of the power feeding layer), the conductor width (the width of the power feeding layer), the distance from the end of the area in which the PKG is mounted to the via connected to the power feeding layer.

For example, the resistance RA of the current path, which leads to the power feeding terminals 21b1 to 21b4 in FIG. 4, is calculated as follows.

FIG. 6 is a view illustrating a calculation example of the resistance of a current path.

A current path P1 represents a current path that leads to the power feeding terminal 21b4 and a current path P2 represents a current path that lead to the power feeding terminal 21b3. In addition, a current path P3 represents a current path that lead to the power feeding terminal 21b2, and a current path P4 represents a current path that leads to the power feeding terminal 21b1.

The via-diameter r of the via 21c4 included in the current path P1 is set to 0.30 mm, the via-diameter r of the vias 21c3 and 21c2 included in the current paths P2 and P3 is set to 0.25 mm, and the via-diameter r of the via 21c1 included in the current path P4 is set to 0.15 mm. In addition, the plating thickness pt of the vias 21c1 to 21c4 is set to 20 μm and an opening-filling resin material injected into the openings of the vias 21c1 to 21c4 is non-conductive.

As parameters not described in FIG. 6, the thickness $t_0$ of the printed circuit board 21 is set to 2.6 mm, and the distances $t_1$, $t_2$, $t_3$, and $t_4$ from the surface on which the PKG is mounted to the power feeding layers 21a1 to 21a4 are set to $t_1$=0.4 mm, $t_2$=1.4 mm, $t_3$=2.4 mm, and $t_4$=2.5 mm. In addition, the thickness $t_s$ of the power feeding layers 21a1 to 21a4 is set to 35 μm, and the distance d between the centers of two adjacent vias having the same distance from the end of the area in which the PKG is mounted is set to 0.8 mm. In addition, the temperature is set to 25° C.

At this time, as illustrated in FIG. 6, the via-resistance RV for the current path P1 is 0.23 mΩ, the via-resistance RV for the current path P2 is 0.34 mΩ, the via-resistance RV for the current path P3 is 0.75 mΩ, and the via-resistance RV for the current path P4 is 1.32 mΩ. In addition, the path-resistance RL for the current path P1 is 1.13 mΩ, the path-resistance RL for the current path P2 is 1.01 mΩ, the path-resistance RL for the current path P3 is 0.51 mΩ, and the path-resistance RL for the current path P4 is 0.00 mΩ. Thus, the resistance RA for the current path P1 is 1.36 mΩ, the resistance RA for the current path P2 is 1.35 mΩ, the resistance RA for the current path P3 is 1.26 mΩ, and the resistance RA for the current path P4 is 1.32 mΩ.

In addition, assuming that the current ratio of the current path P4 to 1.00, the current ratio of the current path P1 is 0.97, the current ratio of the current path P2 is 0.98, and current ratio of the current path P3 is 1.05.

For comparison, a calculation example of the resistance RA of the current path when, in the printed circuit board 21 of FIG. 4, all the vias 21c1 to 21c4 have the same via-diameter and all the power feeding layers 21a1 to 21a4 are connected to each of the vias 21c1 to 21c4 is illustrated.

FIG. 7 is a view illustrating a calculation example of the resistance of a current path in a printed circuit board of the comparative example.

In FIG. 7, the via-diameter r of all the vias 21c1 to 21c4 is set to 0.25 mm. The other conditions are the same as those in FIG. 6, except that all the power feeding layers 21a1 to 21a4 are connected to each of the vias 21c1 to 21c4.

At this time, as illustrated in FIG. 6, all the current paths P1 to P4 have the same via-resistances RV of 0.29 mΩ. In addition, the path-resistance RL for the current path P1 is 0.52 mΩ, the path-resistance RL for the current path P2 is 0.34 mΩ, the path-resistance RL for the current path P3 is 0.17 mΩ, and the path-resistance RL for the current path P4 is 0.00 mΩ. Thus, the resistance RA for the current path P1 is 0.81 mΩ, is 0.63 mΩ for the current path P2, the resistance RA for the current path P3 is 0.46 mΩ, and the resistance RA for the current path P4 is 0.29 mΩ, and thus the resistance components are uneven.

In addition, assuming that the current ratio of the current path 4 is 1.00, the current ratio of the current path P1 is 0.35, the current ratio of the current path P2 is 0.46, and the current ratio of the current path P3 is 0.63. For example, there is a possibility that excessive current will flow to the current path P4.

On the other hand, according to the printed circuit board 21 of the second embodiment, as illustrated in FIG. 6, the resistances RA of the current paths P1 to P4 are equalized. Therefore, excessive current may be suppressed from flowing to the current paths P1 to P4.

Third Embodiment

Figure 8:
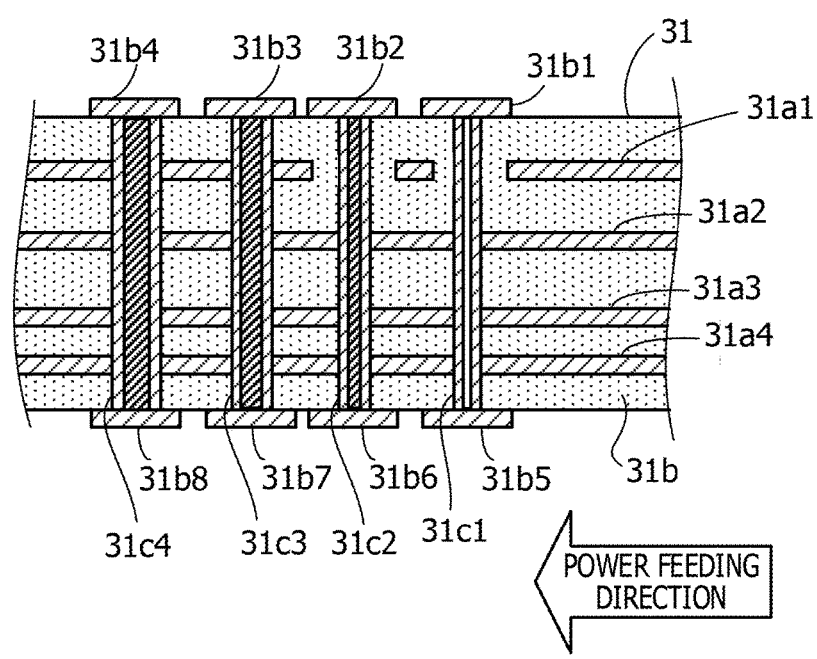
FIG. 8 is a cross-sectional view illustrating an example of a printed circuit board according to a third embodiment.

FIG. 8 is a cross-sectional view illustrating an example of a printed circuit board according to a third embodiment.

In the same manner as the printed circuit board 21 of the second embodiment, the PKG 12 as illustrated in FIG. 1 is mounted on the printed circuit board 31 of the third embodiment, but is not illustrated in FIG. 8.

The printed circuit board 31 includes power feeding layers 31a1, 31a2, 31a3 and 31a4 to which a power supply voltage is applied. The power feeding layers 31a1 to 31a4 are stacked one on another with an insulating material 31b interposed therebetween. As for the power feeding layers 31a1 to 31a4, for example, a conductive material such as, for example, copper is used. In addition, the insulating material 31b is, for example, a plurality of sheets obtained by impregnating paper or glass cloth with an insulating resin. In addition, the number of power feeding layers is not limited to four, and may be one, or five or more.

In addition, the printed circuit board 31 includes a plurality of power feeding terminals (e.g., power feeding terminals 31b1, 31b2, 31b3 and 31b4) disposed in the area in which the PKG is mounted. In addition, in the example of FIG. 8, on the printed circuit board 31, a plurality of power feeding terminals (e.g., power feeding terminals 31b5, 31b6, 31b7 and 31b8) is also formed on a surface opposite to the surface on which the PKG is mounted. As for the plurality of power feeding terminals, for example, a conductive material such as, for example, copper is used.

In addition, the printed circuit board 31 includes a plurality of vias (e.g., vias 31c1, 31c2, 31c3 and 31c4), which electrically interconnects the plurality of power feeding terminals and the power feeding layers. Each via has a plating (e.g., copper plating) formed on the inner wall of an opening thereof and a non-conductive or conductive resin material injected into the opening.

A conductive resin material is injected into a via, which is connected to a power feeding terminal having a short distance from the center of the area in which the PKG is mounted, and a non-conductive resin material is injected into a via, which is connected to a power feeding terminal having a long distance from the center of the area in which the PKG is mounted. In the example of FIG. 8, a conductive resin material is injected into the openings of the vias 31c2 to 31c4, which are connected to the power feeding terminals 31b2 to 31b4 disposed at positions to which the distances from the center of the area in which the PKG is mounted are shorter than a distance to the power feeding terminal 31b1. In addition, a non-conductive resin material is injected into the opening of the via 31c1. In the vias into which the conductive resin material is injected, the cross-sectional area Sp of the conductor portion is increased, so that the via-resistance is decreased.

In addition, in the printed circuit board 31 of the third embodiment, in the same manner as the printed circuit board 11 of the first embodiment, a via, which is connected to a power feeding terminal disposed closer to the end of the area in which the PKG is mounted, has a smaller via-diameter. However, all the via-diameters of the vias connected to the power feeding terminals having different distances from the end of the area in which the PKG is mounted may not necessarily differ from each other. The vias may be formed such that the via-diameters thereof vary stepwise.

In addition, depending on the number of vias to which the conductive resin material is applied, the number of vias to which the non-conductive resin material is applied, and the number or positions of power feeding layers connected to the vias, the resistances of the current paths, which lead to the respective power feeding terminals, may be more equalized when the via-diameters of some via groups do not satisfy the above relationship. In that case, even if the some via groups are connected to a power feeding terminal group, which has a shorter distance from the end of the area in which the PKG is mounted, than another power feeding terminal group connected to the other via groups, the via-diameters of the some via groups may be set to be greater than those of the other via groups.

In addition, in the printed circuit board 31 according to the third embodiment, a via, which is connected to a power feeding terminal disposed at a position to which the distance from the center of the area in which the PKG is mounted is shorter, is also connected to a larger number of power feeding layers. In the example of FIG. 8, the vias 31c3 and 31c4 are connected to four power feeding layers 31a1 to 31a4, whereas the vias 31c1 and 31c2 are connected to three power feeding layers 31a2 to 31a4, the number of which is smaller than the number of power feeding layers 31a1 to 31a4 to which the vias 31c3 and 31c4 are connected.

Figure 9:
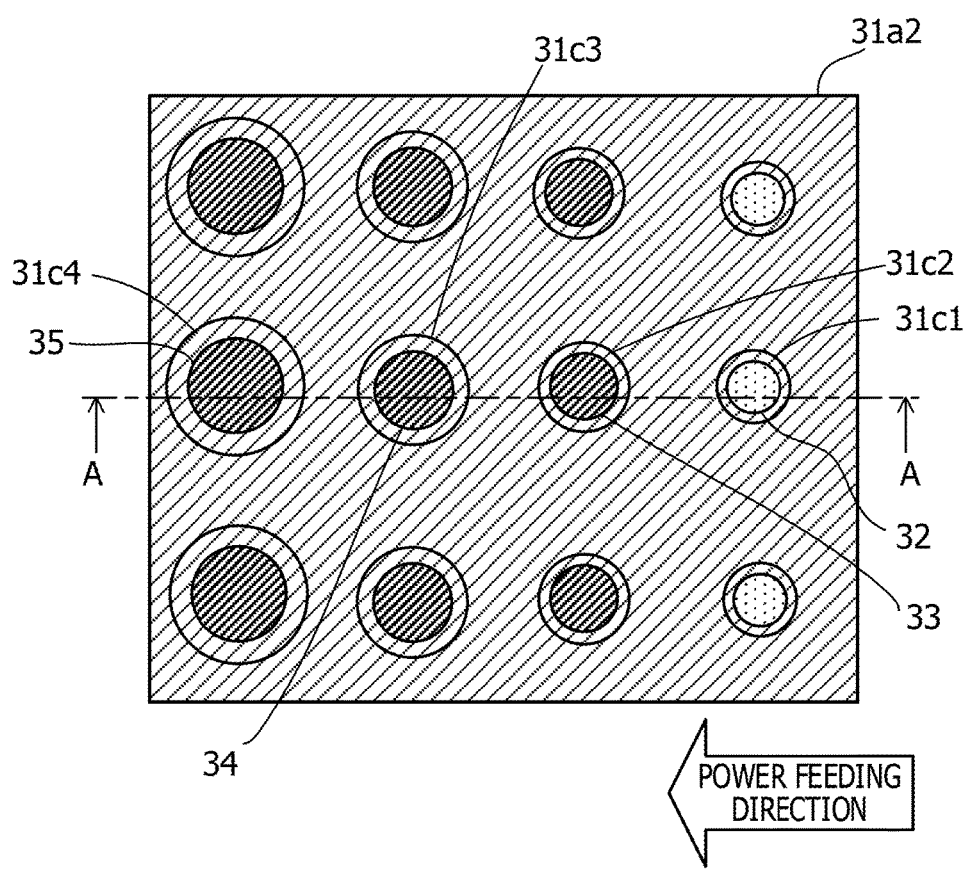
FIG. 9 is a plan view illustrating an example of a power feeding layer and vias.

FIG. 9 is a plan view illustrating an example of a power feeding layer and vias.

FIG. 9 illustrates a plan view of the power feeding layer 31a2. For example, the cross section taken along line A-A in FIG. 9 is illustrated in the cross-sectional view of FIG. 8.

As illustrated in FIG. 9, the power feeding layer 31a2 is connected to the vias 31c1 to 31c4. In addition, a non-conductive resin material 32 is used as an opening-filling resin material in the via 31c1, and conductive resin materials 33, 34 and 35 are used as an opening-filling resin material in the vias 31c2 to 31c4.

With the above-described configuration, the via-resistance of a via (in which the conductive resin material is used) connected to a power feeding terminal close to the center of the area in which the PKG is mounted may be reduced.

In addition, in the printed circuit board 31 of the third embodiment, a via, which is connected to a power feeding terminal disposed at a position to which the distance from the center of the area in which the PKG is mounted is shorter, is also connected to a power feeding layer, which is located closer to the surface on which the PKG is mounted. In the example of FIG. 8, the vias 31c3 and 31c4 are connected to the power feeding layer 31a1, which is located at the closest position to the surface on which the PKG is mounted (the upper surface of the printed circuit board 31 in FIG. 8). The via-resistance of a via, which is connected to a power feeding layer closer to the surface on which the PKG is mounted, is smaller than the via-resistance of a via, which is connected to the power feeding layer located far from the surface on which the PKG is mounted.

With the above configuration, the via-resistance of a via, which is connected to a power feeding terminal close to the end of the area in which the PKG is mounted, may be increased, and the via-resistance of a via, which is connected to a power feeding terminal close to the center of the area, may be reduced.

In addition, as a larger number of power feeding layers are connected to a via, the value of the path-resistance caused by the power feeding layers of the current path including the via is reduced. This is because the path-resistance is the resistance parallel to the path-resistance caused by each of the plurality of power feeding layers connected to the via.

Meanwhile, the path-resistance of each of the power feeding layers 31a1 to 31a4 is smaller in a current path, which leads to a power feeding terminal closer to the end of the area in which the PKG is mounted. This is because the current path, which leads to the power feeding terminal closer to the end of the area in which the PKG is mounted, has a shorter length.

Because the resistance of a current path, which leads to each power feeding terminal, is obtained from the sum of the via-resistance and the path-resistance having the above characteristics, in the printed circuit board 31 of the third embodiment, the resistance values of the respective current paths are also equalized.

For example, when the via-diameter may not be changed to such an extent that unevenness of resistance components may be sufficiently suppressed, due to, for example, layout or process restrictions, the resistance values of the respective current paths may be more equalized by combining the above-described configurations. Therefore, excessive current may be suppressed from flowing due to uneven resistance components.

Hereinafter, a calculation example of resistance of each current path is illustrated.

The resistance (the above-described resistance RA) of a current path, which leads to the power feeding terminals 31b1 to 31b4 in FIG. 8, may be calculated in the same way as in the second embodiment.

FIG. 10 is a view illustrating a calculation example of the resistances of current paths.

The current path P1 represents a current path that leads to the power feeding terminal 31b4, and the current path P2 represents a current path that leads to the power feeding terminal 31b3. In addition, the current path P3 represents a current path that leads to the power feeding terminal 31b2, and the current path P4 represents a current path that leads to the power feeding terminal 31b1.

The via-diameter r of the via 31c4 included in the current path P1 is set to 0.30 mm, the via-diameter r of the via 31c3 included in the current path P2 is set to 0.20 mm, and the via-diameter r of the vias 31c2 and 31c1 included in the current paths P3 and P4 is set to 0.25 mm. In addition, the plating thickness pt of the vias 31c1 to 31c4 is set to 20 μm, a non-conductive material is used as an opening-filling resin material that is injected into the opening of the via 31c1, and a conductive material is used as an opening-filling resin material that is injected into the openings of the vias 31c2 to 31c4.

As parameters not described in FIG. 10, the volume resistivity of the conductive resin material (conductive paste) applied to the vias 31c2 to 31c4 is set to 4.0e-5 Ω·cm. The values of the other parameters are the same as the values of the parameters described in the second embodiment.

At this time, as illustrated in FIG. 10, the via-resistance RV for the current path P1 is 0.21 mΩ, the via-resistance RV for the current path P2 is 0.30 mΩ, the via-resistance RV for the current path P3 is 0.53 mΩ, and the via-resistance RV for the current path P4 is 0.75 mΩ. In addition, the path-resistance RL for the current path P1 is 0.52 mΩ, the path-resistance RL for the current path P2 is 0.34 mΩ, the path-resistance RL for the current path P3 is 0.17 mΩ, and the path-resistance RL for the current path P4 is 0.00 mΩ. Therefore, the resistance RA for the current path P1 is 0.73 mΩ, the resistance RA for the current path P2 is 0.64 mΩ, the resistance RA is 0.70 mΩ for the current path P3, and the resistance RA for the current path P4 is 0.75 mΩ.

In addition, assuming that the current ratio of current path P4 is 1.00, the current ratio of the current path P1 is 1.03, the current ratio of the current path P2 is 1.17, and the current ratio of the current path P3 is 1.07.

As described above, in the printed circuit board 31 of the third embodiment, as illustrated in FIG. 10, the resistances RA of the current paths P1 to P4 are also equalized. Therefore, excessive current may be suppressed from flowing to the current paths P1 to P4.

In addition, in the printed circuit board 31 illustrated in FIG. 8, an opening-filling resin material applied to one via is one of conductive and non-conductive materials, but both a conductive resin and a non-conductive resin may be embedded in one via.

Figure 11:
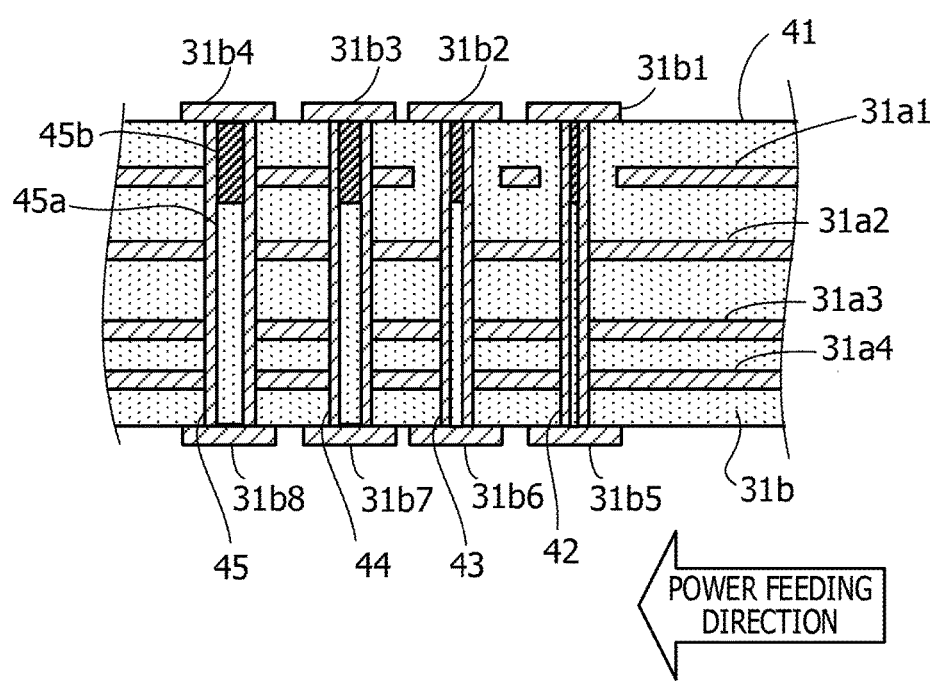
FIG. 11 is a view illustrating a modification of the printed circuit board according to the third embodiment.

FIG. 11 is a view illustrating a modification of the printed circuit board according to the third embodiment.

In FIG. 11, the same reference numerals are given to the same components as the components illustrated in FIG. 8.

In a printed circuit board 41 illustrated in FIG. 11, both a conductive resin material and a non-conductive resin material are embedded as an opening-filling resin material in each of the vias 42, 43, 44 and 45 connected to the power feeding terminals 31b1 to 31b4. For example, a non-conductive resin material 45a and a conductive resin material 45b are embedded in the via 45.

The vias 42 to 45 may be formed, for example, by first embedding one of a non-conductive resin material and a conductive resin material in an opening thereof, etching the material to a predetermined depth, and then filling the other material.

In the printed circuit board 41, the value of the via-resistance may be changed by changing the ratio of the nonconductive resin material to the conductive resin material in each via.

Fourth Embodiment

Figure 12:
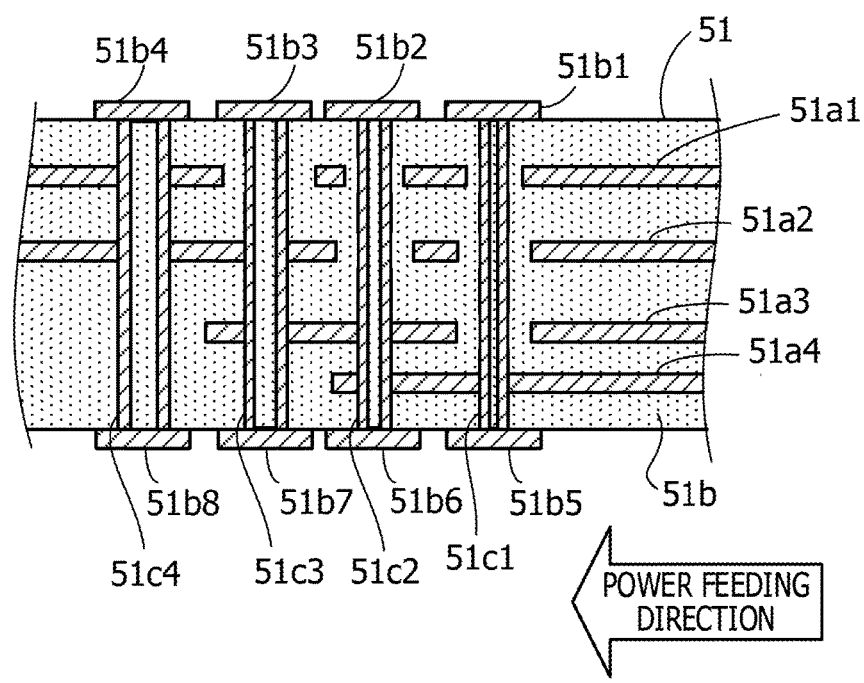
FIG. 12 is a cross-sectional view illustrating an example of a printed circuit board according to a fourth embodiment.

FIG. 12 is a cross-sectional view illustrating an example of a printed circuit board according to a fourth embodiment In the same manner as the printed circuit board 21 of the second embodiment, for example, the PKG 12 as illustrated in FIG. 1 is mounted on a printed circuit board 51 of the fourth embodiment, but is not illustrated in FIG. 12.

The printed circuit board 51 includes power feeding layers 51a1, 51a2, 51a3 and 51a4 to which a power supply voltage is applied. The power feeding layers 51a1 to 51a4 are stacked one on another with an insulating material 51b interposed therebetween. As for the power feeding layers 51a1 to 51a, for example, a conductive material such as, for example, copper is used. In addition, the insulating material 51b is, for example, a plurality of sheets obtained by impregnating paper or glass cloth with an insulating resin. In addition, the number of power feeding layers is not limited to four, and may be one, or five or more.

In addition, the printed circuit board 51 includes a plurality of power feeding terminals (e.g., power feeding terminals 51b1, 51b2, 51b3, and 51b4) disposed in the area in which the PKG is mounted. In the example of FIG. 12, on the printed circuit board 51, a plurality of power feeding terminals (e.g., power feeding terminals 51b5, 51b6, 51b7, and 51b8) is formed on a surface opposite to the surface on which the PKG is mounted. As for the plurality of power feeding terminals, for example, a conductive material such as, for example, copper is used.

In addition, the printed circuit board 51 includes a plurality of vias (e.g., vias 51c1, 51c2, 51c3, and 51c4), which electrically interconnects the plurality of power feeding terminals and the power feeding layers. Each via includes a plating (e.g., copper plating) formed on the inner wall of an opening thereof and a non-conductive resin material injected into the opening (a conductive resin material may be used as in the third embodiment).

In addition, in the printed circuit board 51 of the fourth embodiment, in the same manner as the printed circuit board 11 of the first embodiment, a via, which is connected to a power feeding terminal disposed closer to the end of the area in which the PKG is mounted, has a smaller via-diameter. However, all the via-diameters of the vias connected to power feeding terminals having different distances from the end of the area in which the PKG is mounted may not necessarily differ from each other. The vias may be formed such that the via-diameters thereof vary stepwise.

In addition, for some via groups, even if the some via groups are connected to a power feeding terminal group, to which a distance from the end of the area in which the PKG is mounted is shorter than a distance to another power feeding terminal group connected to other via groups, the via-diameters of the some via groups may be set to be greater than those of the other via groups.

In addition, in the printed circuit board 51 of the fourth embodiment, a via is connected to, for example, a power feeding layer as described below.

Figure 13:
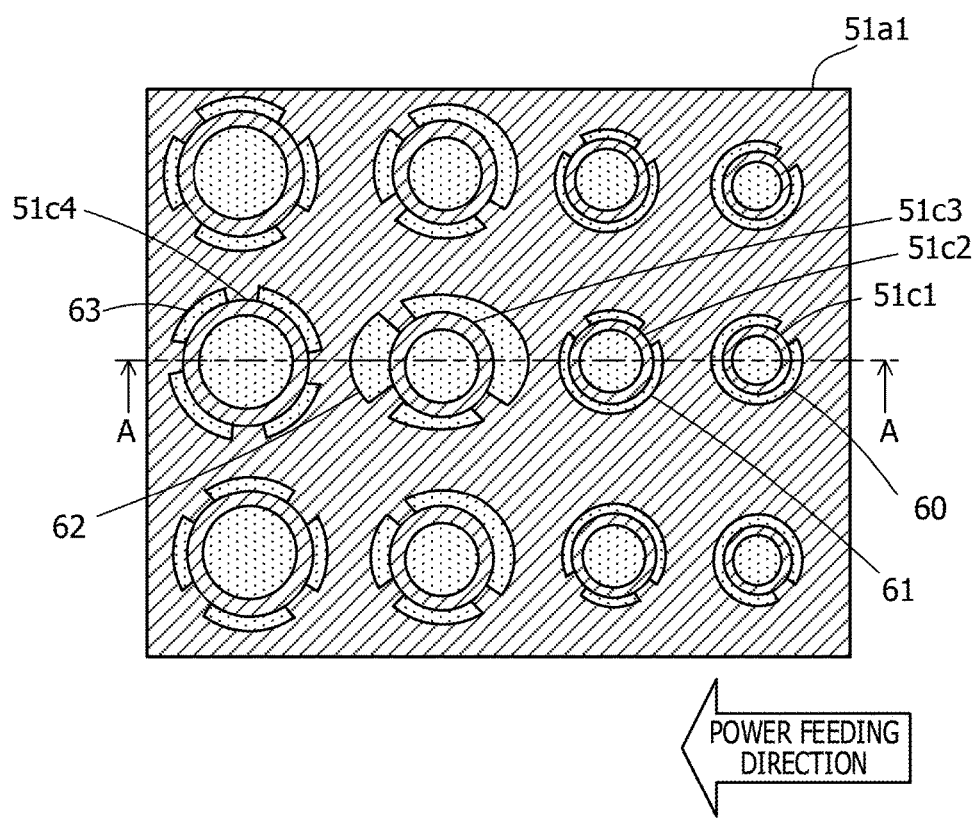
FIG. 13 is a plan view illustrating an example of a power feeding layer and vias.

FIG. 13 is a plan view illustrating an example of a power feeding layer and vias.

FIG. 13 illustrates a plan view of the power feeding layer 51a1. For example, the cross section taken along line A-A in FIG. 13 is illustrated in the cross-sectional view of FIG. 12 described above.

As illustrated in FIG. 13, clearances 60, 61, 62 and 63, which are patterned to be partially connected to the vias 51c1 to 51c4, are formed in the power feeding layer 51a1. That is, in the power feeding layer 51a1, the number of connection points to the vias 51c1 to 51c4 is limited.

For example, the clearance 60 is formed to provide one connection point for the via 51c1, and the clearance 61 is formed to provide two connection points for the via 51c2.

The clearance 62 is formed to provide three connection points for the via 51c3, and the clearance 63 is formed to provide four connection points for the via 51c4.

As the number of connection points is increased, the path-resistance of the current path, which leads to each of the power feeding terminals 51b1 to 51b4 connected to the vias 51c1 to 51c4, is decreased.

In addition, as illustrated in FIG. 13, the clearance 62 is formed in an elliptical shape, the long axis of which extends in a power feeding direction. Thus, a conductor portion between the vias 51c2 and 51c4, which are adjacent to each other in the power feeding direction, is narrow, and the path-resistance thereof increases.

For example, when the via-diameter may not be changed to such an extent that unevenness of resistance components may be sufficiently suppress, due to, for example, layout or process limitations, the resistance values of the respective current paths may be more equalized by combining the above-described configurations. Therefore, excessive current may be suppressed from flowing due to uneven resistance components.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A printed circuit board comprising:
   a power feeding layer to which a power supply voltage is applied;
   a plurality of power feeding terminals that is disposed in an area, in which an electronic component is mounted, and supplies current based on the power supply voltage supplied from a power source to the electronic component through the power feeding layer and the plurality of power feeding terminals; and
   a plurality of vias each of which directly and electrically interconnects each of the plurality of power feeding terminals and the power feeding layer, and is formed such that a via coupled to a power feeding terminal disposed closer to the power source has a smaller via-diameter to reduce a difference in path resistances between the plurality of power feeding terminals.

2. The printed circuit board according to claim 1, wherein, among the plurality of vias, a first via, which is coupled to a second power feeding terminal disposed at a position to which a distance from the end of the area is shorter than a distance to a first power feeding terminal, is located in a current path, in which the current flows, upstream of a second via coupled to the first power feeding terminal, and the first via has a first via-diameter smaller than a second via-diameter of the second via.

3. The printed circuit board according to claim 1, wherein, among the plurality of vias, a third via, which is coupled to a fourth power feeding terminal disposed at a position to which a distance from a center of the area is shorter than a distance to a third power feeding terminal, is coupled to a larger number of power feeding layers than a fourth via, which is coupled to the third power feeding terminal.

4. The printed circuit board according to claim 1, wherein a plurality of power feeding layers is provided including the power feeding layer, and among the plurality of vias, a fifth via, which is coupled to a sixth power feeding terminal disposed at a position to which a distance from a center of the area is shorter than a distance to a fifth power feeding terminal, is coupled to a second power feeding layer among the plurality of power feeding layers, the fifth power feeding terminals being located closer to a surface on which the electronic component is mounted, than a first power feeding layer coupled to a sixth via coupled to the fifth power feeding terminal.

5. The printed circuit board according to claim 1, wherein, among the plurality of vias, a conductive resin material is embedded in a seventh via, which is coupled to an eighth power feeding terminal disposed at a position to which a distance from a center of the area is shorter than a distance to a seventh power feeding terminal, and a non-conductive resin material is embedded in the eighth via, which is coupled to the seventh power feeding terminal.

6. The printed circuit board according to claim 5, wherein both the conductive resin material and the non-conductive resin material are embedded in the seventh via.

7. The printed circuit board according to claim 1, wherein the power feeding layer is formed with an opening, which is patterned to be partially coupled to a ninth via among the plurality of vias.

8. The printed circuit board according to claim 7, wherein the opening has an elliptical shape, a long axis of which extends in a power feeding direction.

9. An electronic device comprising:

an electronic component; and a printed circuit board including:

a power feeding layer to which a power supply voltage is applied;

a plurality of power feeding terminals that is disposed in an area, in which an electronic component is mounted, and supplies current based on the power supply voltage supplied from a power source to the electronic component through the power feeding layer and the plurality of power feeding terminals; and a plurality of vias each of which directly and electrically interconnects each of the plurality of power feeding terminals and the power feeding layer, and is formed such that a via coupled to a power feeding terminal disposed closer to the power source has a smaller via-diameter to reduce a difference in path resistances between the plurality of power feeding terminals.

\* \* \* \* \*